United States Patent
Porter

(10) Patent No.: US 11,005,501 B2
(45) Date of Patent: May 11, 2021

(54) ERROR CORRECTION ON A MEMORY DEVICE

(71) Applicant: Micron Technology, Inc., Boise, ID (US)

(72) Inventor: John David Porter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 39 days.

(21) Appl. No.: 16/279,483

(22) Filed: Feb. 19, 2019

(65) Prior Publication Data

US 2020/0266838 A1  Aug. 20, 2020

(51) Int. Cl.
*H03M 13/00* (2006.01)
*H03M 13/29* (2006.01)
*G11C 29/52* (2006.01)
*G06F 11/10* (2006.01)

(52) U.S. Cl.
CPC ..... *H03M 13/2906* (2013.01); *G06F 11/1068* (2013.01); *G11C 29/52* (2013.01)

(58) Field of Classification Search
None
See application file for complete search history.

(56) References Cited

U.S. PATENT DOCUMENTS

2007/0033490 A1*  2/2007  Moosrainer ......... G06F 11/1044
                                                           714/763
2012/0151301 A1    6/2012  Izumi et al.
2013/0179748 A1    7/2013  Dong et al.
2014/0013183 A1*   1/2014  Sohn .................. H03M 13/3707
                                                           714/763
2014/0053041 A1    2/2014  Sakaue et al.
(Continued)

FOREIGN PATENT DOCUMENTS

KR  20090122219 A  11/2009
KR  20140108398 A   9/2014

OTHER PUBLICATIONS

S. Srinivasa, X. Li, M. Chang, J. Sampson, S. K. Gupta and V. Narayanan, "Compact 3-D-SRAM Memory With Concurrent Row and Column Data Access Capability Using Sequential Monolithic 3-D Integration," in IEEE Transactions on Very Large Scale Integration (VLSI) Systems, vol. 26, No. 4, pp. 671-683, Apr. 2, 2018.*

(Continued)

*Primary Examiner* — Daniel F. McMahon
(74) *Attorney, Agent, or Firm* — Holland & Hart LLP

(57) ABSTRACT

Some instances of a memory device include a memory die having an array of memory cells including a plurality of banks. In some cases, the memory die further includes a first error correcting code (ECC) circuit coupled with a first bank of memory cells, where the first ECC circuit is configured to perform operations associated with a first access operation (e.g., write operation) of the first bank of memory cells. In some examples, the memory die further includes a second ECC circuit coupled with the first bank of memory cells, where the second ECC circuit is configured to perform ECC operations associated with a second access operation (e.g., read operation) of the first bank. In some cases, the first ECC circuit is located under the footprint of the array and the second ECC circuit is located outside the footprint of the array.

24 Claims, 8 Drawing Sheets

(56) References Cited

U.S. PATENT DOCUMENTS

| | | | |
|---|---|---|---|
| 2015/0067448 A1* | 3/2015 | Son | G11C 29/52 |
| | | | 714/773 |
| 2016/0364291 A1* | 12/2016 | Kang | G11C 29/52 |
| 2017/0083401 A1* | 3/2017 | Ryu | G06F 3/0619 |
| 2017/0109231 A1* | 4/2017 | Cha | G06F 11/1068 |
| 2018/0189207 A1* | 7/2018 | Nale | G06F 12/0238 |
| 2018/0261300 A1* | 9/2018 | Shimizu | G06F 11/1048 |
| 2019/0140668 A1* | 5/2019 | Kim | G06F 11/1048 |
| 2019/0324854 A1* | 10/2019 | Park | G06F 11/1076 |

OTHER PUBLICATIONS

ISA/KR, International Search Report and Written Opinion of the International Searching Authority, Int'l Appl. No. PCT/US2020/016366, dated May 22, 2020, Korean Intellectual Property Office, Seo-gu, Daejeon, Republic of Korea, 11 pgs.

* cited by examiner

ERROR CORRECTION ON A MEMORY DEVICE

BACKGROUND

The following relates generally to a system that includes at least one memory device and more specifically to error correction on a memory device.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

Improving memory devices, generally may include increasing memory cell density, increasing read/write speeds, increasing reliability, increasing data retention, reducing power consumption, or reducing manufacturing costs, among other metrics. Some memory devices may be configured to perform error correcting operations. Improving an efficiency (e.g., faster operation, decreased die size) of a memory array may also be desired.

DETAILED DESCRIPTION

Figure 1:
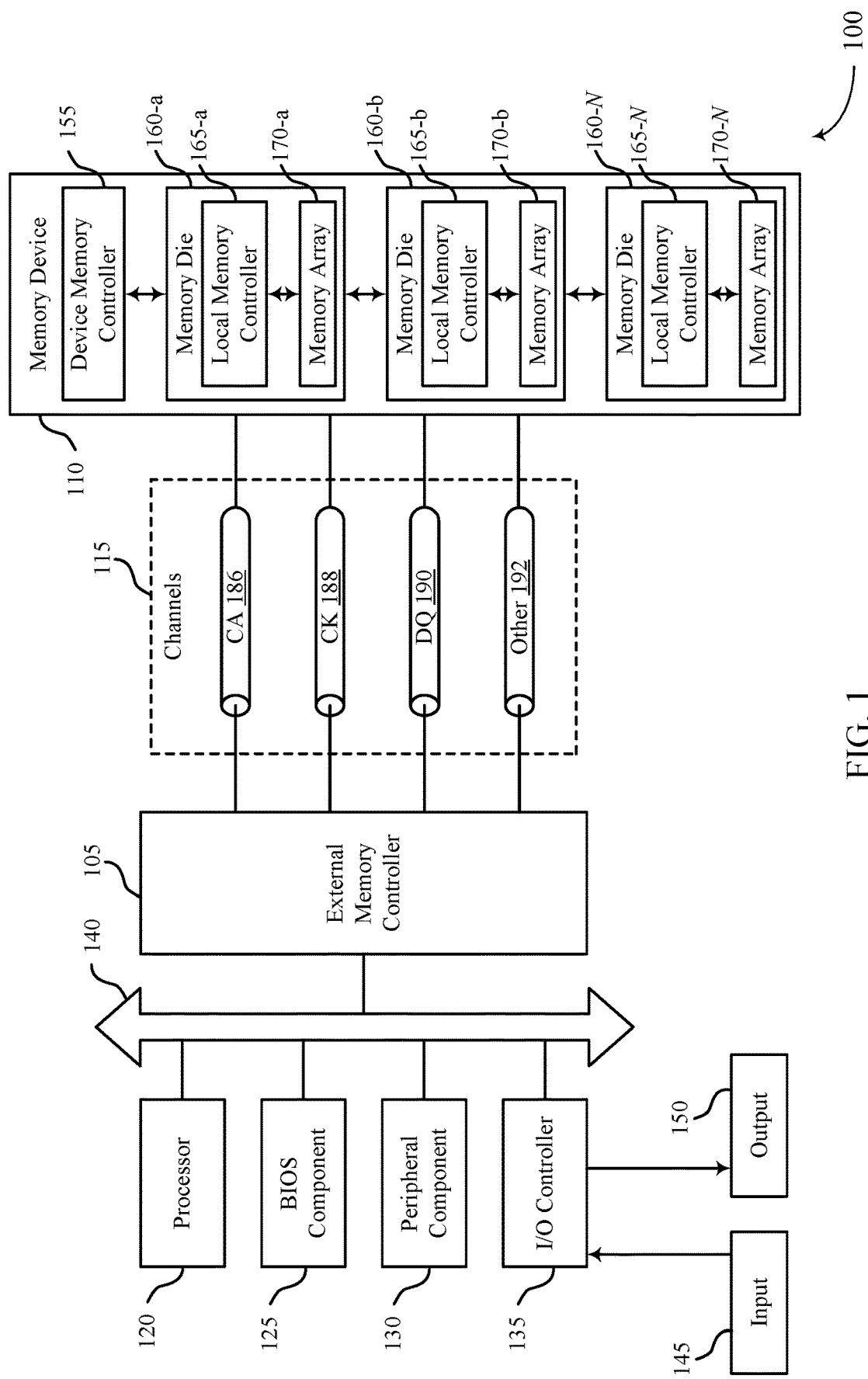
FIG. 1 illustrates an example of a system that supports error correction on a memory device in accordance with examples as disclosed herein.

Memory devices may perform operations for detecting or correcting errors in data, such as error correcting code (ECC) operations as part of one or more access operations (e.g., read or write) performed on memory cells of the memory device. A memory device may include one or more circuits for performing the ECC operations. Examples of ECC operations may include single-error correcting (SEC) operations or single-error correcting, double-error detecting (SECDED) operations. In some cases, an ECC circuit may be associated with a bank of memory cells and perform ECC operations for access operations associated with its corresponding bank of memory cells. On a die, an ECC circuit may occupy space (e.g., surface area) thereby reducing the area available for memory cells on the die. The size of the ECC circuit may be decreased by dispersing the ECC circuits across open/free spaces of the die that are not occupied by other components. However, dispersing the ECC circuits may reduce efficiency (e.g., decrease accuracy, reduce speed, etc.) of ECC operations performed on the memory device.

In some examples, a memory device may have a memory die that includes a first ECC circuit for performing a first set of ECC operations and a second ECC circuit for performing a second set of operations. The first and second ECC circuits may be configured to increase the efficiency (e.g., memory density, speed of access operations, reliability, etc.) of a memory device.

For example, the first ECC circuit may be configured to perform ECC processes associated with write operations (e.g., write, masked write, wear leveling). Further, the first ECC circuit may be located on a layer separate from the array of memory cells that is under the array of memory cells (e.g., within the footprint of the array of memory cells) thereby maintaining the memory cell density of the array of memory cells. The second ECC circuit may be configured to perform ECC processes associated with read operations. In some cases, the memory device may perform more read operations than write operations. The second ECC circuit may have a structure that performs ECC operations faster than the first ECC circuit. Further, the second ECC circuit may be located outside the footprint of the array of memory cells to maintain memory cell density of the array of memory cells. Accordingly, the first and second ECC circuits may be independently configured to increase the efficiency of a memory device.

Techniques for error correction on a memory device are described. A memory device may include an array of memory cells that includes a plurality of banks. A first ECC circuit may be coupled with a first bank of the plurality of banks and perform ECC operations associated with a first access operation (e.g., a write operation). The first ECC circuit may receive data associated with the first access operation and perform a first ECC operation as part of the first access operation. The data may be stored on the first bank of the memory device. A second ECC circuit may be coupled with the first bank and perform ECC operations associated with a second access operation (e.g., a read operation). During the second access operation, the second ECC circuit may receive the data stored at the first bank of the memory device. The second ECC circuit may perform a second ECC operation as part of the read operation. In some cases, the second circuit may modify the data received from the bank based on performing the second ECC operation.

Features of the disclosure are initially described in the context of a memory system and memory die as described with reference to FIGS. 1-3. Features of the disclosure are described in the context of memory die diagrams and a process flow diagram as described with reference to FIGS. 4-6. These and other features of the disclosure are further illustrated by and described with reference to an apparatus diagram and flowcharts that relate to error correction on a memory device as described with references to FIGS. 7-8.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include portions of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose graphic processing unit (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth.

In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2. The memory dice 160 may include ECC circuits for correcting errors associated with storing data on the one or more memory arrays 170. For example, the ECC circuits may correct single bit errors associated with access operations (e.g., read and write operations) of one or more memory cells. In some, cases each memory die 160 may include a first ECC circuit and a second ECC circuit. The first ECC circuit may be configured to perform one or more ECC operations associated with a first set of access operations (e.g., a read or a write operation). The second ECC circuit may be configured to perform one or more ECC operations (e.g., SEC or SECDED) associated with a second set of access operations (e.g., a read or a write operation). The first and second ECC circuits may be configured independently. In some cases, first and second ECC circuits may occupy separate locations on a memory die 160.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

In either 2D or 3D memory device, each memory die 160 may have multiple layers (e.g., multiple levels each containing one or more components for performing access operations). A first layer of a memory die 160 may include an array of memory cells and a second layer may include supporting circuitry, such as one or more digit line drivers or associated components, one or more word line drivers or associated components, one or more plate line drivers or associated components, one or more sense components or associated components. In some examples, supporting circuitry may include multiplexing (mux) components, such as mux signal amplifiers or the like. One or more of the first ECC circuits may be located on the same or a different layer than a second ECC circuit. In some cases, multiple first ECC circuits may be located on the second layer of each memory dice 160 and the second ECC circuit may also be located on the second layer of an ECC dice 160. The first ECC circuits may be positioned on the second layer and below the memory cells of each memory array 170 and the second ECC circuits may also be located on the second layer and positioned outside the footprint of the memory cells of each memory array 170.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120. In some cases, local memory controller 165 may be configured to control ECC operations for one or more ECC circuits associated with memory device 110. In some examples, local memory controller 165, may control ECC circuits associated with one or more memory arrays 170.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal. In some cases, external memory controller 105 may be configured to control ECC operations for one or more ECC circuits associated with memory device 110. In some examples, external memory controller 105, may control ECC circuits associated with a one or more memory arrays 170.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be x4 (e.g., including four signal paths), x8 (e.g., including eight signal paths), x16 (including sixteen signal paths), and so forth. Signals communicated over the channels may use a double data rate (DDR) timing scheme. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK may therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110.

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

Figure 2:
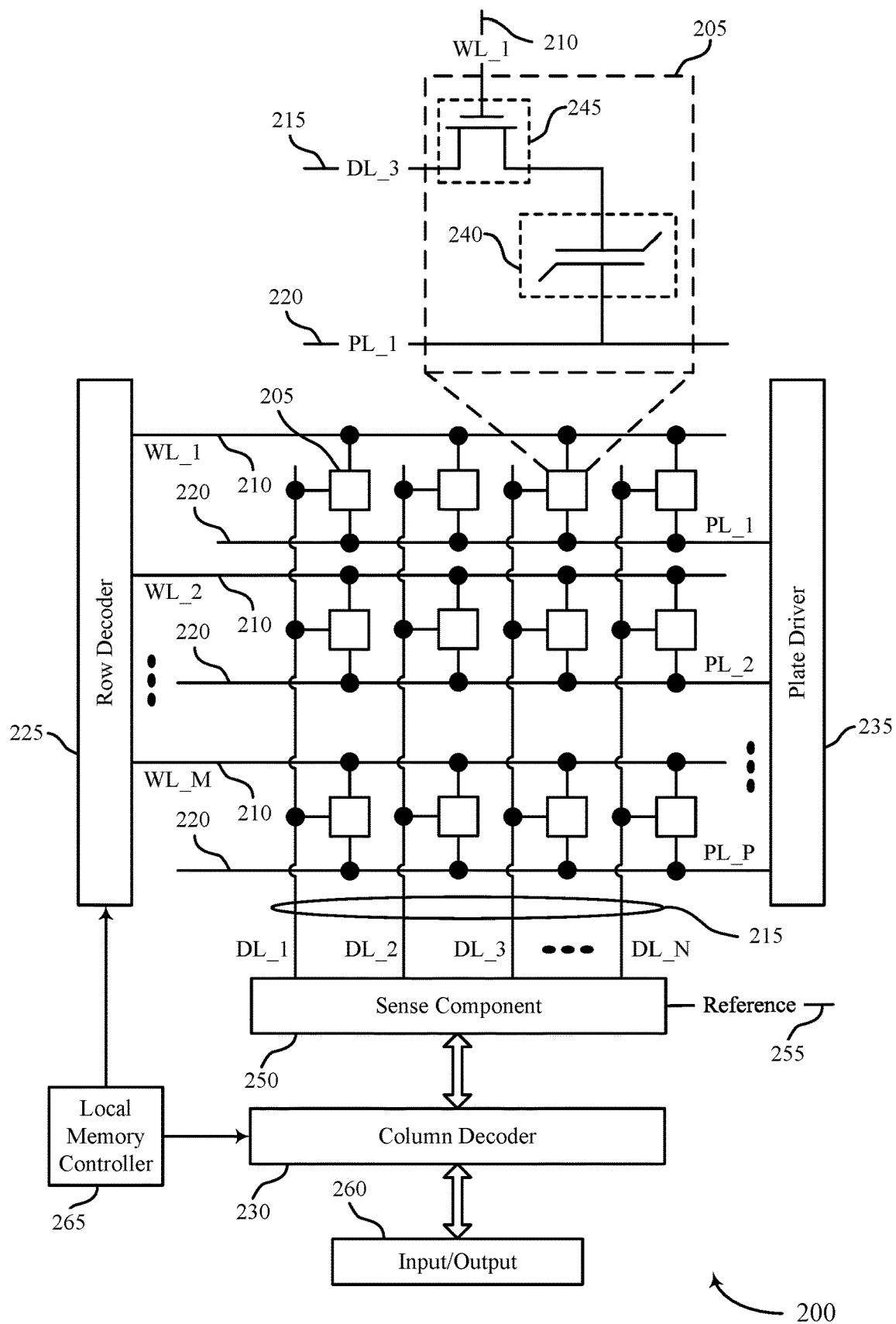
FIG. 2 illustrates an example of a memory die that supports error correction on a memory device in accordance with examples as disclosed herein.

FIG. 2 illustrates an example of a memory die 200 in accordance with examples as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a state (e.g., polarization state or dielectric charge) that represents digital data. In FeRAM architectures, the memory cell 205 may include a capacitor that includes a ferroelectric material to store a charge and/or a polarization representative of the programmable state. In DRAM architectures, the memory cell 205 may include a capacitor that includes a dielectric material to store a charge representative of the programmable state.

Operations such as reading and writing may be performed on memory cells 205 by activating or selecting access lines such as a word line 210, a digit line 215, and/or a plate line 220. In some cases, digit lines 215 may also be referred to as bit lines. References to access lines, word lines, digit lines, plate lines or their analogues, are interchangeable without loss of understanding or operation. Activating or selecting a word line 210, a digit line 215, or a plate line 220 may include applying a voltage to the respective line.

The memory die 200 may include the access lines (e.g., the word lines 210, the digit lines 215, and the plate lines 220) arranged in a grid-like pattern. Memory cells 205 may be positioned at intersections of the word lines 210, the digit lines 215, and/or the plate lines 220. By biasing a word line 210, a digit line 215, and a plate line 220 (e.g., applying a voltage to the word line 210, digit line 215, or plate line 220), a single memory cell 205 may be accessed at their intersection.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address. For example, the memory die 200 may include multiple word lines 210, labeled WL_1 through WL_M, multiple digit lines 215, labeled DL_1 through DL_N, and multiple plate lines, labeled PL_1 through PL_P, where M, N, and P depend on the size of the memory array. Thus, by activating a word line 210, a digit line 215, and a plate line 220, e.g., WL_1, DL_3, and PL_1, the memory cell 205 at their intersection may be accessed. The intersection of a word line 210 and a digit line 215, in either a two-dimensional or three-dimensional configuration, may be referred to as an address of a memory cell 205. In some cases, the intersection of a word line 210, a digit line 215, and a plate line 220 may be referred to as an address of the memory cell 205.

The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated. In some cases, the switching component 245 is a transistor and its operation is controlled by applying a voltage to a transistor gate, where the voltage differential between the transistor gate and transistor source is greater or less than a threshold voltage of the transistor. In some cases, the switching component 245 may be a p-type transistor or an n-type transistor. The word line 210 may be in electronic communication with the gate of the switching component 245 and may activate/deactivate the switching component 245 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be configured to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be configured to selected couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may be configured to cooperate with the digit line 215 to bias the capacitor 240 during access operation of the memory cell 205.

The sense component 250 may be configured to detect a state (e.g., a polarization state or a charge) stored on the capacitor 240 of the memory cell 205 and determine a logic state of the memory cell 205 based on the detected state. The charge stored by a memory cell 205 may be extremely small, in some cases. As such, the sense component 250 may include one or more sense amplifiers to amplify the signal output of the memory cell 205. The sense amplifiers may detect minute changes in the charge of a digit line 215 during a read operation and may produce signals corresponding to either a logic 0 or a logic 1 based on the detected charge. During a read operation, the capacitor 240 of memory cell 205 may output a signal (e.g., discharge a charge) to its corresponding digit line 215. The signal may cause a voltage of the digit line 215 to change. The sense component 250 may be configured to compare the signal received from the memory cell 205 across the digit line 215 to a reference signal 255 (e.g., a reference voltage). The sense component 250 may determine the stored state of the memory cell 205 based on the comparison. For example, in binary-signaling, if digit line 215 has a higher voltage than the reference signal 255, the sense component 250 may determine that the stored state of memory cell 205 is a logic 1, and, if the digit line 215 has a lower voltage than the reference signal 255, the sense component 250 may determine that the stored state of the memory cell 205 is a logic 0. The sense component 250 may include various transistors or amplifiers to detect and amplify a difference in the signals. The detected logic state of memory cell 205 may be output through column decoder 230 as output 260. In some cases, the sense component 250 may be part of another component (e.g., a column decoder 230, row decoder 225). In some cases, the sense component 250 may be in electronic communication with the row decoder 225, the column decoder 230, and/or the plate driver 235.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some cases, one or more of the row decoder 225, column decoder 230, and plate driver 235, and sense component 250 may be co-located with the local memory controller 265. The local memory controller 265 may be configured to receive one or more commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations.

The local memory controller 265 may generate row, column, and/or plate line address signals to activate the target word line 210, the target digit line 215, and the target plate line 220. The local memory controller 265 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 265 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 265 may identify a target memory cell 205 on which to perform the write operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or the target plate line 220 (e.g., applying a voltage to the word line 210, digit line 215, or the plate line 220), to access the target memory cell 205. The local memory controller 265 may apply a specific signal (e.g., voltage) to the digit line 215 and a specific signal (e.g., voltage) to the plate line 220 during the write operation to store a specific state in the capacitor 240 of the memory cell 205, the specific state being indicative of a desired logic state.

The memory die 200 may be configured to perform one or more ECC operations as part of a write operation on one or more memory cells 205. In some cases, the memory die 200 may include one or more ECC circuits for performing error correcting operations (e.g., SEC or SECDED) associated with write operations. For example, memory die 200 may include multiple first ECC circuits configured to perform write ECC operations. Each first ECC circuit (e.g., write ECC circuit) may be associated with a subset of memory cells 205 located on memory die 200. In some cases, each first ECC circuit may be associated with a bank of memory cells 205 on memory die 200 and configured to perform write ECC operations associated with writing data to that bank of memory cells 205. In some examples, the local memory controller 265 may be configured to perform one or more aspects of write ECC operations on memory cells 205 located one memory die 200. This may include local memory controller 265 controlling which write ECC circuit/ memory cells 205 receive data associated with a write operation, storing parity data associated with write operations, modifying data based on the one or more ECC operations, transmitting information related to the write ECC operations for example to a host device or the like, or a combination thereof.

In some cases, the local memory controller 265 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 265 may identify a target memory cell 205 on which to perform the read operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or a target plate line 220 (e.g., applying a voltage to the word line 210, the digit line 215, or the plate line 220), to access the target memory cell 205. The target memory cell 205 may transfer a signal to the sense component 250 in response to biasing the access lines. The sense component 250 may amplify the signal. The local memory controller 265 may fire the sense component 250 (e.g., latch the sense component) and thereby compare the signal received from the memory cell 205 to the reference signal 255. Based on that comparison, the sense component 250 may determine a logic state that is stored on the memory cell 205. The local memory controller 265 may communicate the logic state stored on the memory cell 205 to the external memory controller 105 (or the device memory controller) as part of the read operation.

The memory die 200 may be configured to perform one or more ECC operations as part of a read operation on one or more memory cells 205. In some cases, the memory die 200 may include one or more ECC circuits for performing error correcting operations (e.g., SEC or SECDED) associated with read operations. For example, memory die 200 may include a second ECC circuit configured to perform read ECC operations. The second ECC circuit (e.g., write ECC circuit) may be associated with multiple banks of memory cells 205 located on memory die 200. In some cases, the second ECC circuit may be configured to perform read ECC operations for all memory cells 205 on memory die 200. In some examples, the local memory controller 265 may be configured to perform one or more aspects of read ECC operations on memory cells 205 located one memory die 200. This may include local memory control 265 controlling read ECC operations on memory cells 205, transmitting parity data associated with read operations, modifying data based on the one or more read ECC operations, transmitting information related to the read ECC operations for example to a host device, or the like, or a combination thereof.

Figure 3A:
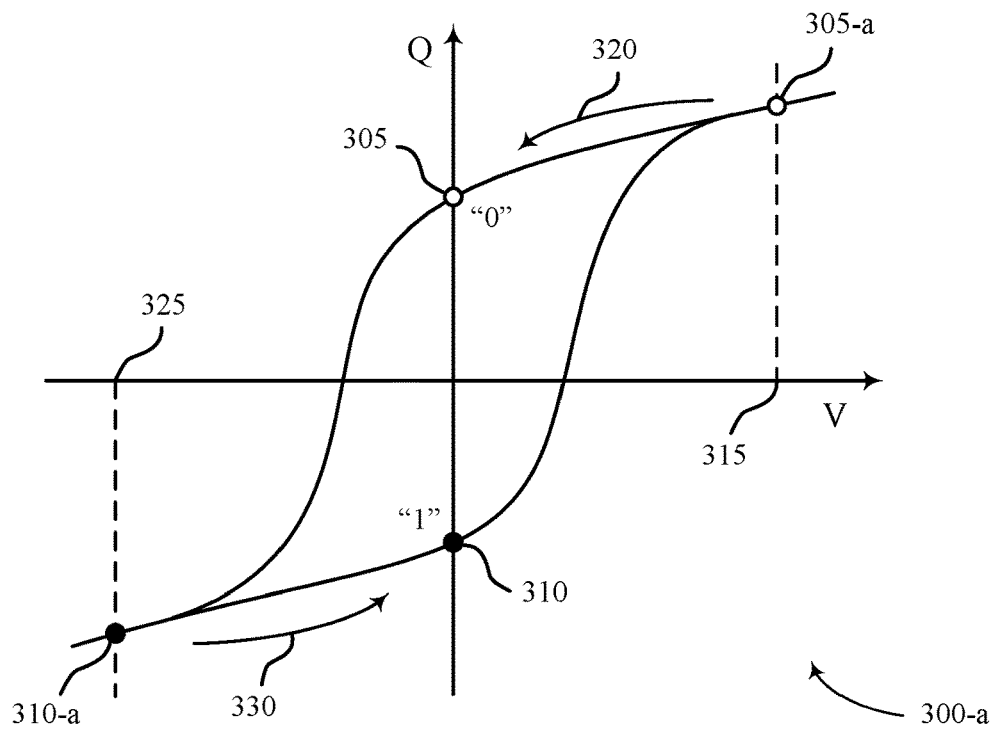
FIGS. 3A and 3B illustrate examples of hysteresis curves that support error correction on a memory device in accordance with examples as disclosed herein.
Figure 3B:
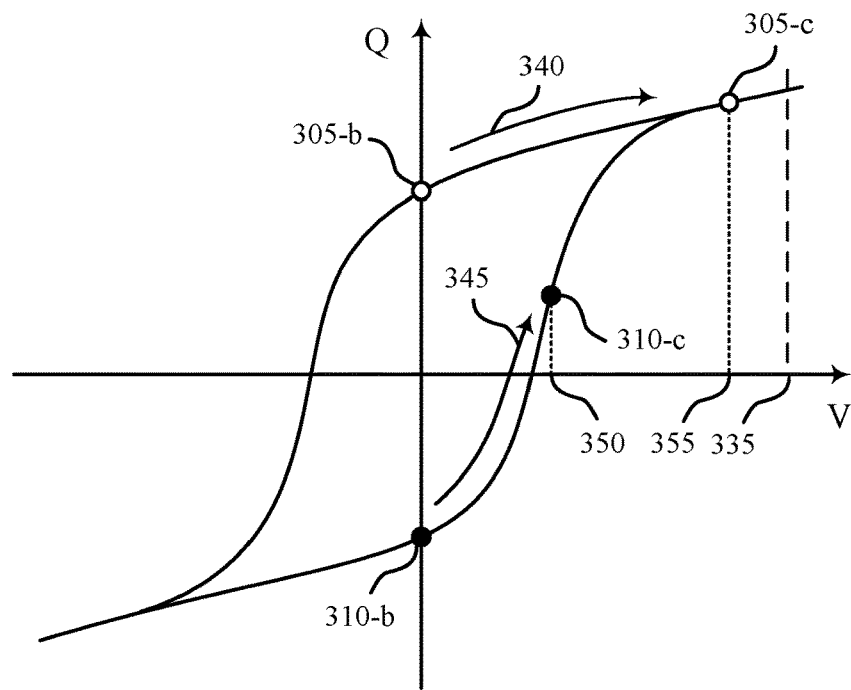

FIGS. 3A and 3B illustrate examples of non-linear electrical properties of a ferroelectric memory cell with hysteresis curves 300-a and 300-b in accordance with various examples as disclosed herein. Hysteresis curves 300-a and 300-b illustrate an example ferroelectric memory cell writing and reading process, respectively. Hysteresis curves 300-a and 300-b depict the charge, Q, stored on a ferroelectric capacitor (e.g., capacitor 240 described with reference to FIG. 2) as a function of a voltage difference, V.

A ferroelectric material is characterized by a spontaneous electric polarization, that is, it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations.

Hysteresis curves 300-a and 300-b may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, the voltages in hysteresis curves 300-a and 300-b represent a voltage difference across the capacitor and are directional. For example, a positive voltage may be realized by applying a positive voltage to the terminal in question (e.g., a cell plate) and maintaining the second terminal (e.g., a cell bottom) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300-a and 300-b.

As depicted in hysteresis curve 300-a, the ferroelectric material may maintain a positive or negative polarization with a zero-voltage difference, resulting in two possible charged states: a charge state 305 and a charge state 310. According to the examples of FIGS. 3A and 3B, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage. Similarly, charge state 310 is written by applying a net negative voltage 325, which results in charge state 310-a. After removing negative voltage 325, charge state 310-a follows path 330 until it reaches charge state 310 at zero voltage. Charge states 305-a and 310-a may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-*b* or 310-*b* was initially stored. For example, hysteresis curve 300-*b* illustrates two possible stored charge states 305-*b* and 310-*b*. Voltage 335 may be applied across the capacitor 240 as discussed with reference to FIG. 2. In other cases, a fixed voltage may be applied to the cell plate and, although depicted as a positive voltage, voltage 335 may be negative. In response to voltage 335, charge state 305-*b* may follow path 340. Likewise, if charge state 310-*b* was initially stored, then it follows path 345. The final position of charge state 305-*c* and charge state 310-*c* depend on one or more factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. A voltage measured at a sense component may not equal voltage 335 and instead may depend on the voltage of the digit line. The position of final charge states 305-*c* and 310-*c* on hysteresis curve 300-*b* may thus depend on the capacitance of the digit line and may be determined through a load-line analysis—i.e., charge states 305-*c* and 310-*c* may be defined with respect to the digit line capacitance. As a result, the voltage of the capacitor, voltage 350 or voltage 355, may be different and may depend on the initial state of the capacitor.

By comparing the digit line voltage to a reference voltage, the initial state of the capacitor may be determined. The digit line voltage may be the difference between voltage 335 and the final voltage across the capacitor, voltage 350 or voltage 355—i.e., the difference between the voltage 335 and the voltage 350 or the different between the voltage 335 and the voltage 355. A reference voltage may be generated such that its magnitude is between the two possible voltages of the two possible digit line voltages to determine the stored logic state—i.e., if the digit line voltage is higher or lower than the reference voltage. Upon comparison by the sense component, the sensed digit line voltage may be determined to be higher or lower than the reference voltage, and the stored logic value of the ferroelectric memory cell (i.e., a logic 0 or 1) may be determined.

In some cases, a ferroelectric memory cell may maintain the initial logic state after a read operation. For example, if charge state 305-*b* is stored, the charge state may follow path 340 to charge state 305-*c* during a read operation and, after removing voltage 335, the charge state may return to initial charge state 305-*b* by following path 340 in the opposite direction. In some cases, a ferroelectric memory cell may lose its initial logic state after a read operation. For example, if charge state 310-*b* is stored, the charge state may follow path 345 to charge state 305-*c* during a read operation and, after removing voltage 335, the charge state may relax to the charge state 305-*b* by following path 340.

Hysteresis curve 300-*b* illustrates an example of reading a memory cell that is configured to store the charge state 305-*b* and the charge state 310-*b*. A read voltage 335 may be applied, for example, as a voltage difference via a digit line 215 and a plate line 220 as described with reference to FIG. 2. Hysteresis curve 300-*b* may illustrate read operations where the read voltage 335 is negative voltage difference Vcap (e.g., where Vbottom−Vplate is negative). A negative read voltage across the capacitor may be referred to as a "plate high" read operation, where a plate line 220 is taken initially to a high voltage, and a digit line 215 is initially at a low voltage (e.g., a ground voltage). Although read voltage 335 is shown as a negative voltage across the ferroelectric capacitor 240, in alternative operations a read voltage may be a positive voltage across the ferroelectric capacitor 240, which may be referred to as a "plate low" read operation.

The read voltage 335 may be applied across the ferroelectric capacitor 240 when a memory cell 205 is selected (e.g., by activating a switching component 245 as described with reference to FIG. 2). Upon applying the read voltage 335 to the ferroelectric capacitor 240, charge may flow into or out of the ferroelectric capacitor 240 via the digit line 215 and plate line 220, and different charge states may result depending on whether the ferroelectric capacitor 240 was at charge state 305-*a* (e.g., a logic 1) or at charge state 310-*a* (e.g., a logic 0).

One or more errors may occur during a read, write or storage operations of a charge on a memory cell. In some cases, errors introduced by read, write or storage operations may be corrected by performing one or more error correction operations. A memory die 200 may include a first ECC circuit for performing a first set of ECC operations in association with a first set of access operations (e.g., write, masked write, wear level, or the like). The first ECC circuit may correct errors (e.g., single bit errors) as part of performing the first set of accesses operations. In some cases, this may include storing parity data or modifying data stored on memory cells as part of the first set of access operations. A memory die 200 may also include a second ECC circuit for performing a second set of ECC operations in associated with a second set of access operations (e.g., read operations). The second ECC circuit may correct errors (e.g., single bit errors) as part of performing the second set of access operations. In some cases, this may include receiving data along with parity data stored on memory cells, modifying received data, transmitting information associated with ECC operations to other components or devices associated with a memory device (e.g., a host device), or a combination thereof.

Figure 4:
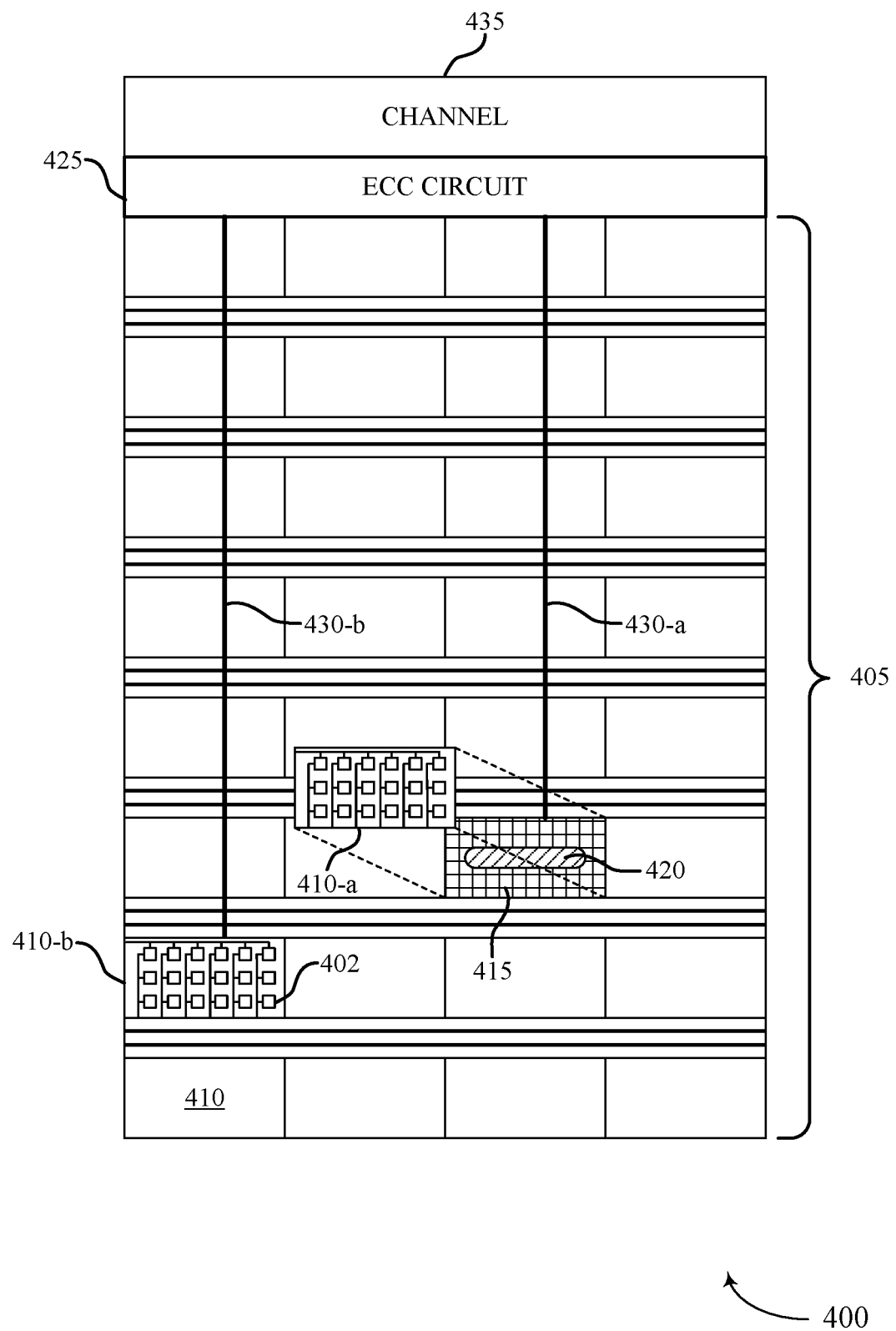
FIG. 4 illustrates an example of a memory die that supports error correction on a memory device in accordance with examples as disclosed herein.

FIG. 4 illustrates an example of a memory die 400 that supports error correction on a memory device in accordance with examples as disclosed herein. The memory die 400 illustrates an example of a memory die layout or memory die plan from a top view perspective. The memory die 400 may be an example of memory dice 160 or 200 described with reference to FIGS. 1 and 2. The memory die 400 may also include one or more components described with reference to FIGS. 1-3. For example, the memory die 400 may include an array 405 of memory cells 402, which may be an example of memory array 170 or memory cells 205 described with reference to FIGS. 1 and 2; one or more banks 410; supporting circuits 415, which may be examples of a row decoder 225, a column decoder 230, and a plate driver 235, a sense component 250 or the like, or a combination thereof of as described with reference to FIG. 2; a first ECC circuit 420 and a second ECC circuit 425, which may be examples of error correcting components described with reference to FIGS. 1 and 2; one or more data busses 430, which may be examples of data transport components, conductive lines, data paths, or the like such as those described with reference to FIGS. 1-3; and channel 435, which may be an example of one or more channels 115 described with reference to FIG. 1.

The memory die 400 may be configured to perform one or more access operations (e.g., write, masked write, wear leveling, read, or the like) on one or more memory cells 402 of the array 405. In some cases, the one or more access operations may include a write operation on one or more of the memory cells 402, which may include writing a logic state (e.g., logic 1 or logic 0), performing a masked write operation, performing a wear leveling operation, or the like. The one or more access operations may also include a read operation on the one or more of the memory cells 402, such as reading a logic state (e.g., logic 1 or logic 0) stored on a memory cell 402. The memory die 400 may be further configured to transmit data associated with the access operations to the channel 435. In some examples, the channel 435 may transmit the data to one or more other components or devices (e.g., a host device) associated with the memory die 400 or a memory device.

The memory die 400 may include multiple memory cells 402 associated with the array 405. The array 405 of memory cells 402 may include a plurality of banks 410. Each bank may contain a subset of the memory cells 402 in the array 405. In some cases, some or all of the memory cells 402 in the array 405 may be positioned in a repeating pattern of memory cells. For example, as illustrated, the array 405 may include thirty-two banks 410 of memory cells positioned in a four by eight rectangular configuration. This array 405 configuration is presented for illustrative purposes and various array configurations are possible including circular, diagonal, random, offset, or other arrangements.

The memory die 400 may also include one or more supporting circuits 415 (only one shown for clarity), which may be configured to perform one or more processes associated with access operations of the memory cells 402 in the array 405. For example, the supporting circuit 415 may include one or more digit line drivers or associated components, one or more word line drivers or associated components, one or more plate line drivers or associated components, one or more sense components or associated components. In some examples, the supporting circuit 415 may include multiplexing (mux) components, such as mux signal amplifiers or the like. In some cases, the supporting circuit 415, may be located on a different substrate layer from memory cells 402. For example, a supporting circuit 415 may be located on a substrate located below the first bank 410-*a* of memory cells 402. In some cases, the supporting circuit 415 may be a complementary metal-oxide-semiconductor (CMOS) circuit located under the array, which may be referred to as CMOS under the array (CuA). The supporting circuit 415 may be a bank 410 level circuit and support access operations for a first bank 410-*a* of memory cells 402. Accordingly, array 405 may have multiple supporting circuits 415, each associated with a portion of the array 405, for example, each supporting circuit 415 may be associated with a bank 410 of memory cells 402. In some cases, each supporting circuit 415 may only take up a portion of the space (e.g., surface area) of a bank 410.

The memory die 400 may also include a first ECC circuit 420 (only one shown for clarity) configured to perform error correction operations associated with an access operation. In some cases, the first ECC circuit 420 may perform single bit error correction operations on data associated with memory cells 402 in array 405. In this regard, first ECC circuit 420 may generate or process parity data associated with data transferred to and from the array 405. In some cases, the first ECC circuit 420 may be positioned under the footprint of the array 405 of memory cells 402. This may include the first ECC circuit 420 being positioned under the footprint of the first bank 410-*a* of memory cells 402. For example, first the first ECC circuit 420 may be a bank level circuit associated with a bank 410 of memory cells 402.

Additionally or alternatively, the first ECC circuit 420 may be located/positioned on the same substrate layer under a bank 410 of memory cells 402 as the supporting circuit 415. For example, the first bank 410-*a* of memory cells 402 may be located on a first layer of the memory die 400 and the supporting circuit 415 and the first ECC circuit 420 may be located on a second layer of the memory die 400 positioned below the first bank 410-*a* of memory cells 402. In some cases, the supporting circuit 415 and first ECC circuit 420 may be distributed across the first bank 410-*a*. In this regard, FIG. 4 illustrates representative areas that each of the supporting circuit 415 and first ECC circuit 420 may occupy of the bank 410. As described in greater detail with reference to FIG. 5, the supporting circuitry may occupy a first portion of the second layer (e.g., CuA) of the bank 410-*a* and the first ECC circuit 420 may occupy a second portion of the second layer. For example, the first ECC circuit 420 may be located/distributed within free spaces around the supporting circuit 415.

In some cases, the first ECC circuit 420 may be configured to perform one or more ECC operations as part of a write operation (e.g., write, masked write, wear leveling, or the like) on a bank 410 of memory cells 402. The first ECC circuit 420 may be configured with a circuit structure that decreases the area on the substrate taken up by the first ECC circuit 420, for example to fit the first ECC circuit 420 within the area of a bank 410 not taken up by the supporting circuit 415. For example, in cases where the first ECC circuit 420 includes exclusive or (XOR) gates, the first ECC circuit 420 may include unbalanced XOR gates to decrease the area (e.g., surface area) occupied by the first ECC circuit 420. In some cases, first ECC circuit 420 may include a circuit design that improves the performance of write operations. This may include improving the accuracy, speed, efficiency, or the like of write operations to memory cells 402 of a bank 410.

The memory die 400 may further include a second ECC circuit 425 configured to perform error correction operations associated with an access operation. In some cases, the second ECC circuit 425 may perform single bit error correction operations on data associated with memory cells 402 in array 405. In this regard, second ECC circuit 425 may generate or process parity data associated with data transferred to and from array 405. In some cases, the second ECC circuit 425 may be positioned outside of the footprint of array 405 of memory cells 402. This may include the second ECC circuit 425 being positioned at the edge of the array 405 of memory cells 402. In this regard, the second ECC circuit 425 may perform error correcting operations for the array 405 of memory cells 402.

In some examples, the second ECC circuit 425 may be located on a same layer or level as the first ECC circuits 420. In this case, the second ECC circuit may be located on a layer that is below the array 405 of memory cells 402 while being positioned outside the footprint of the array 405 of memory cells 402. That is, the array 405 of memory cells are positioned above the first ECC circuits 420, but not positioned above the second ECC circuit 420.

In some cases, the second ECC circuit 425 may be configured to perform one or more ECC operations as part of read operations on the array 405 of memory cells 402. For example, the second ECC circuit 425 may be configured with a circuit structure that increase the speed of read ECC operations as compared to a first ECC circuit 420 performing write operations. A memory device may perform many more read operations than write operations. As such, improving the speed of read ECC operations may have a larger impact on the overall performance of the memory device that write ECC operations. In contrast, the first ECC circuit 420 may be distributed across various portions of a bank 410, for example routed between free space not taken up by supporting circuit 415.

In some cases, distributing the first ECC circuit 420 across a bank 410 may increase the path length of the circuit, for example, by requiring long interconnects (e.g., conductive paths) between various components (e.g., transistor, XOR gates, or the like) of first ECC circuit 420. Accordingly, error correction operations performed on first ECC circuit 420 may be slower or subject to less accurate circuits (e.g., unbalance XOR gates) as compared to an ECC circuit that is not subject to the same space constraints. In this regard, the second ECC circuit 425 may be configured as a higher density circuit or positioned in a dedicated area on memory die 400, and thus, be configured to, for example, increase the speed of error correction operations associated with a data read of the array 405.

The second ECC circuit 425 may include different types or configurations of circuit components as compared to the first ECC circuit 420. That is, although the first ECC circuit 420 and second ECC circuit 425 may have some similar circuit structures (e.g., transistor configurations, XOR gate configurations, or the like) that are present in each circuit, the first ECC circuit 420 and second ECC circuit 425 structures may be independently configured for performing their respective operations (e.g., first ECC circuit 420 performing write ECC operations and second ECC circuit 425 performing read ECC operations). For example, the first ECC circuit 420 may include unbalanced XOR gates (e.g., to reduce the circuit size) and second ECC circuit 425 may include balanced XOR gates.

In further examples, the second ECC circuit may include a first set of transistors configured to increase read ECC operations as compared to first ECC circuit 420, which may include a second set of transistors configured to reduce power consumption. The first ECC circuit 420 and the second ECC circuit 425 may also include transistors with different voltage thresholds, input/output connections, or the like. In some cases, the second ECC circuit 425 may include shorter interconnects (e.g., conductive paths) between components, different layout of components, or the like, or a combination thereof. In some examples, the second ECC circuit 425 may be positioned between the array 405 of memory cells 402 and the channel 435. For example, the second ECC circuit 425 may be positioned at an edge of array 405 and separate the array 405 from the channel 435.

Memory die 400 may include one or more data busses 430 configured to transport data between the array 405 and the second ECC circuit 425. The data busses 430 may couple a bank 410 of memory cells 402 with the second ECC circuit 425. For example, a data bus 430 may include one or more conductive paths between a bank 410 and the second ECC circuit 425. In some cases, the memory die 400 may include multiple data busses 430, for example, a separate data bus 430 may couple each bank 410 with the second ECC circuit 425. In other cases, a single data bus 430 may couple multiple banks 410 with second ECC circuit 425.

For example, a single data bus 430 could couple each bank 410 in a column of memory banks 410 with the second ECC circuit 425. Data bus 430 may be configured to transmit data including parity data associated with read operations of the array 405. For example, parity data associated with an access operation (e.g., write operation) may be stored at the first bank 410-*a* of memory cells 402. In some examples, the stored parity data may be generated by the first ECC circuit 420 configured as a CuA circuit. Accordingly, during a read operation, data including the stored parity data may be transmitted from the first bank 410-*a* of memory cells 402 to the second ECC circuit 425 via a first data bus 430-*a*.

In some cases, the second ECC circuit 425 may be configured to perform a read ECC operation on data received from the array 405 based on receiving the associated parity data. In some cases, the second ECC circuit 425 may determine an error indication for the data based on performing the ECC operation associated with reading the data. The second ECC circuit 425 may further correct the data based identifying the error indication. Additionally or alternatively the second ECC circuit 425 may transmit the corrected data to the channel 435.

Figure 5:
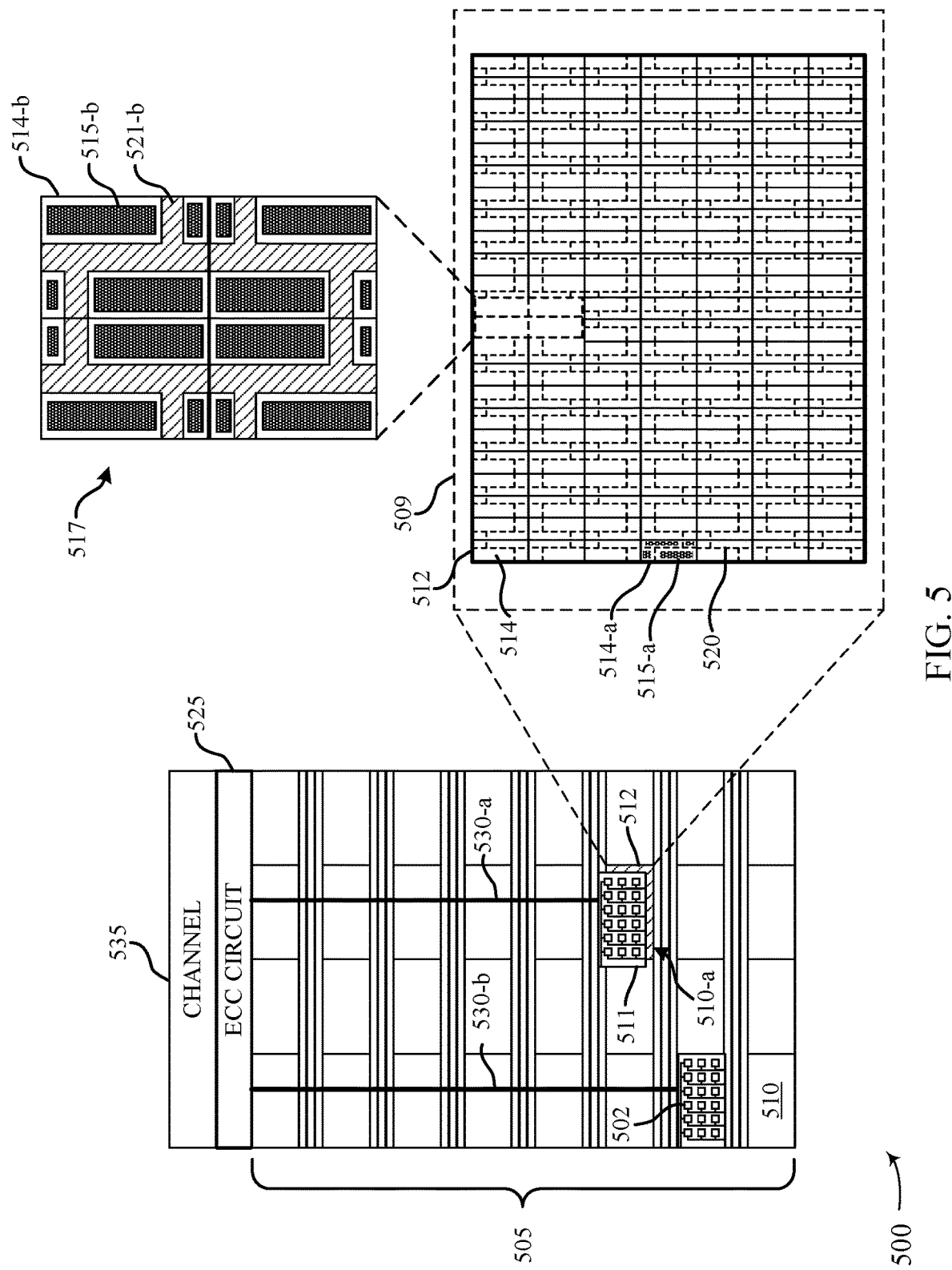
FIG. 5 illustrates an example of a memory die that supports error correction on a memory device in accordance with examples as disclosed herein.

FIG. 5 illustrates an example of a memory die 500 that supports error correction on a memory device in accordance with examples as disclosed herein. The memory die 500 illustrates an example of a memory die layout or memory die plan from a top view perspective. The memory die 500 may be an example of memory die 160, 200 or 400 described with reference to FIGS. 1, 2 and 4. The memory die 500 may also include one or more components described with reference to FIGS. 1-4.

For example, the memory die 500 may include an array 505 of memory cells 502, which may be an example of memory array 170, memory cells 205 or the array 405 of memory cells 402 described with reference to FIGS. 1, 2 and 4; one or more banks 510, which may be an example of banks 410 described with reference to FIG. 4; supporting circuit 515, which may be an example of supporting circuit 415 described with reference to FIG. 4; a first ECC circuit 520 and a second ECC circuit 525, which may be examples of first and second ECC circuits 420 and 425 described with reference to FIG. 4; one or more data busses 530, which may be examples of data busses 430 described with reference to FIG. 4; and channel 535, which may be an example of channel 435 described with reference to FIG. 4. Memory die 500 may further include a first layer 511 of memory cells 502 and a second layer 512 including one or more supporting circuits 515 and first ECC circuit 520, which may be examples of supporting circuits 415 and first ECC circuits 420 described with reference to FIG. 4.

FIG. 5 further illustrates a detailed view 509 of the second layer 512 of the first bank 510-*a*. The detailed view 509, illustrates that the second layer 512 may include or be dived into multiple tiles 514 (e.g., patches) whose boundaries are represented by solid lines. Each tile 514 may comprise a supporting circuit 515 (only the first supporting circuit 515-*a* is shown in a first tile 514-*a* for clarity) which is represented by shaded boxes within the first tile 514-*a*. The second layer 512 may also include a first ECC circuit 520, which is represented by broken lines in detailed view 509. In some cases, each tile 514 may be associated with a subset of memory cells 502 of the array 505. For example, the supporting circuit 515-*a* located in tile 514-*a* may support access operations for a first set of memory cells 502 (not shown in detailed view 509) located on the first layer 511 of the first bank 510-*a*.

In some implementations, the supporting circuits 515 may include one or more digit line drivers or associated components, one or more word line drivers or associated components, one or more plate line drivers or associated components, one or more sense components or associated components. In some examples, the supporting circuits 515 may include multiplexing (mux) components, such as mux signal amplifiers or the like. In some cases, the one or more supporting circuits 515 may be a CMOS circuit located under the array (e.g., CuA). Additionally or alternatively, in some implementations, the supporting circuits 515 may be a tile 514 level circuit. For example, the first supporting circuits 515-a may support access operations for the first tile 514-a associated with a set of memory cells 502. Accordingly, each bank 510 in array 505 may have multiple supporting circuits 515, each associated with a portion of the array 505, for example, each supporting circuit 515 may be associated with a tile 510. In some cases, each supporting circuit 515 may only take up a portion of the space (e.g., surface area) of a tile 514.

The first ECC circuit 520 (represented with broken lines in detailed view 509) may be distributed/routed across the second layer 512 of the first bank 510-a. In some cases, the first ECC circuit 520 may be a bank level circuit. That is, the first ECC circuit 520 may perform error correcting operations for the bank 510-a of memory cells 502. In this regard, the first ECC circuit 520 may be associated with or distributed across multiple tiles 514. For example, the first bank 510-a may include a 7×23 array of tiles (i.e., 161 tiles) each including a supporting circuit 515 (e.g., first bank 510-a has 161 supporting circuits). In this example, a single first ECC circuit 510 may be distributed across the 161 tiles, for example as shown by the broken lines in detailed view 509. In other implementations, multiple supporting circuits 515 may be associated with each bank 510.

FIG. 5 further illustrates a detailed view 517 of four tiles 514 of the first bank 510-a. A second tile 514-b (upper right-hand box bounded by solid lines) may contain a second supporting circuit 515-b (represented by four shaded boxes) distributed across the foot print of the second tile 514-b. As described here, the second supporting circuit 515-b may be configured to perform different processes for access operations of memory cells 502 (not shown in detailed view 517) associated with the second tile 514-b. The tiles 514 may also contain sub-sections 521 (shown in dotted lines) of the first ECC circuit 520. For example, the first ECC circuit 520 may include a variety of components for performing error correcting operations.

In some examples, the first ECC circuit 520 may include multiple XOR gates, conductive lines coupling the XOR gates (e.g., interconnects), or the like. Accordingly, a first sub-section 521-b of the first ECC circuit 520 located within the second tile 514-b may contain a portion of the XOR gates or portions of the interconnects for the first ECC circuit 520. In this regard, the first ECC circuit 520 may include a plurality of subsections located within the space of each tile 514. Accordingly, memory die 500 may include one or more first ECC circuits 510 without decreasing the density of memory cells 502 located on a first layer 511 of the array 505.

The memory die 500 may also include a second ECC circuit 525 located outside the footprint of the array 505 of memory cells 502. The second ECC circuit 525 may occupy a portion of the memory die 500. That is, the second ECC circuit 525 may be located on a portion of the substrate that is distinct from other components (e.g., the array 505 of memory cells 502 or the channel 535) of the memory die 500. In some cases, the second ECC circuit 525 may be configured to increase the efficiency (e.g., speed, accuracy, reliability, or the like) of error correcting operations associated with access operations of the array 505. For example, the second ECC circuit 525 may be configured to perform ECC operations associated with read operations on the array 505 of memory cells 502. Therefore, the second ECC circuit 525 may be configured with components (e.g., XOR gates, transistors, etc.) that increase the speed of read operations on the array 505 as compared to the first ECC circuit 520. In some cases, that includes the second ECC circuit 525 being configured to perform ECC operations for read operations on the array 505 faster than the first ECC circuit 520 is configured to perform write operations of similar size on the array 505.

The second ECC circuit 525 may be further configured to receive data including parity data from the array 505 via one or more data busses 530. In some cases, the second ECC circuit 525 may be located at an edge of the array 505 and separate all or a portion of the array 505 from the channel 535. Additionally or alternatively, the second ECC circuit 525 may be an array 505 level circuit and be configured to perform ECC operations for multiple banks 510 of the array 505. In some cases, the memory die 500 may include multiple second ECC circuits 525.

In some examples, the second ECC circuit 525 may be configured to detect or correct data received from the array 505. For example, the second ECC circuit 525 may be configured to receive data (including parity data) from the array 505 and modify the data based on performing an ECC operation. In some cases, the second ECC circuit 525 may be configured to generate a syndrome associated with data received from the array. The syndrome may indicate an error, an error type, a number of errors, or the like associated with data received from the array 505. The second ECC circuit 525 may modify the data based on the syndrome, transmit the syndrome to one or more other components associated with the memory die 400 (e.g., controller), or a combination thereof.

Figure 6:
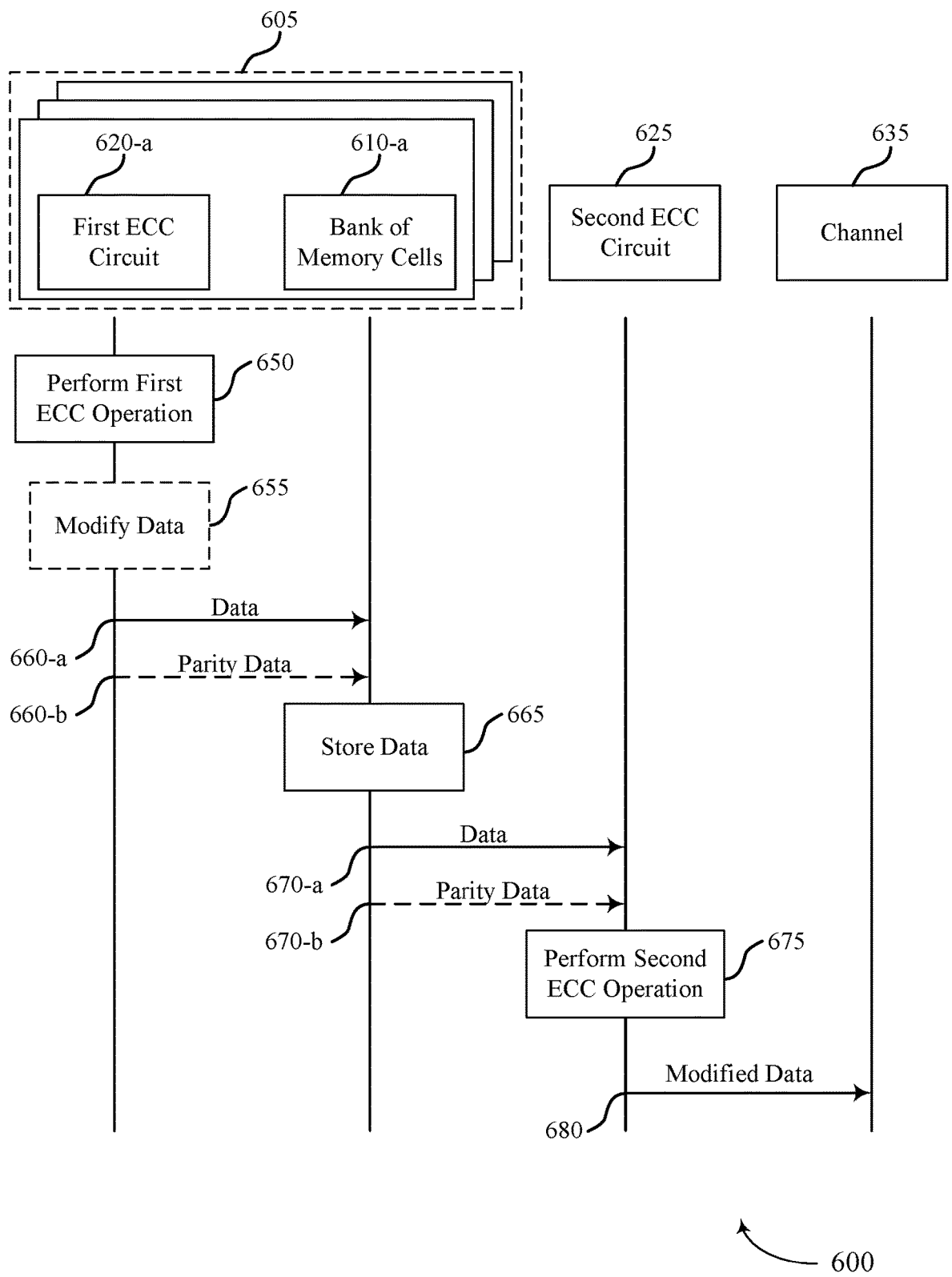
FIG. 6 illustrates an example of a process flow that supports error correction on a memory device in accordance with examples as disclosed herein.

FIG. 6 illustrates an example of a process flow 600 that supports error correction on a memory device in accordance with examples as disclosed herein. In some examples, process flow 600 may implement portions of system 100 or memory die 200, 400 or 500. Process flow 600 may include a first array 605 of memory cells, which may be examples of the arrays 405, 505 of memory cells 402, 502 described with reference to FIGS. 4-5. The process flow may further include a first ECC circuit 620, first bank of memory cells 610, second ECC circuit 625 and channel 635, which may be examples of the first ECC circuits 420, 520, banks 410, 510, second ECC circuits 425, 525 and channels 435, 535 described with reference to FIGS. 4-5. The process flow 600 includes functions or processes implemented on a memory die in the context of error correction described herein.

At 650, the first ECC circuit 620 may perform a first ECC operation on data associated with an access operation on the memory array 605. In some cases, this may include receiving a write command, for example, at the local memory controller. Then, based on receiving the write command, write data may be transmitted to first array 605 and received by the first ECC circuit 620. The first ECC circuit 620 may perform a first ECC operation on the received data. The first ECC operation may include an on-die ECC operation and the first ECC circuit 620 may generate parity data based on receiving the data. The parity data may be configured to be stored in the memory array 605 along with the data and may be configured to detect errors in the data. In some cases, instead of generating parity data, the parity data may be generated by the host device and may be transferred along with the data and received by the first ECC circuit 620. In some examples, the first ECC operation may include a link ECC operation and the first ECC circuit 620 may determine whether there are errors in the received data, for example based on receiving parity information. In some implementations, the first ECC operation may include both on-die and link ECC operations.

At 655, the first ECC circuit 620 may optionally modify the data based on performing the first ECC operation. In some cases, the ECC circuit 620 may perform this modification when performing link ECC. In some cases, the first ECC circuit may modify the data to include the parity data or configure the parity data to be stored independently of the received data. In some cases, for example in association with a link ECC operation, the first ECC circuit may correct one or more errors in the received data before the data is stored on the memory array 605.

The first ECC circuit 620 may also generate information corresponding to performing a first ECC operation at 650. For example, the first ECC circuit 620 may determine that there are one or more errors associated with the received data and reject the data (e.g., not transmit the received data to be stored at memory array 605). Accordingly, the first ECC circuit 620 may transmit an indication to one or more devices such as host device or local memory controller that the received data will not be stored. In some cases, transmitting the indication may result in the data being sent again.

At 660, the first ECC circuit 620 may transmit the data including parity data generated at the first ECC operation (e.g., 650) to a bank of memory cells 610. Transmitting data to the bank of memory cells 610 may occur automatically as part of performing the first ECC operation or may be controlled by the local memory controller or other device such as a host device. The first ECC circuit 620, may be a bank level circuit as described herein. In this regard, the first ECC circuit 620-a may correspond to a first bank of memory cells 610-a. For example, a first ECC circuit 620-a may be a CuA circuit located under a first bank of memory cells 610-a. Thus, at 660, transmitting data to the first bank of memory cells 610-a may include transmitting modified data and or parity data from the first ECC circuit 620-a performing the first ECC operation at 650 to the first bank of memory cells 610-a. In some cases, the array 605 may include multiple banks of memory cells 610 each associated with a first ECC circuit 620. Accordingly, multiple first ECC circuits 620 of the array 605 may, at 650, perform the first ECC operation independently and at, 655, store data to a corresponding bank of memory cells 610. This may allow multiple ECC operations for a memory array 605 to be performed simultaneously, thereby increasing the efficiency of first ECC operations.

At 665, the bank of memory cells 610 may receive data and parity data from the first ECC circuit 620 and store the data at one or more memory cells of the bank. In some cases, the data or parity data may be stored at a first bank of memory cells 610-a that is associated with the first ECC circuit 620-a. In other cases, the data may be stored at the first bank of memory cells 610-a and the parity data may be stored independent of the first data. In some case this may include storing the parity data at a different bank or set of memory cell.

The memory array 605 may support both write operation (e.g., 650-665) and read operations (e.g., 670-680). Different types of access operations may use different ECC circuits.

At 670, the data may be transmitted to the second ECC circuit 625 as part of a second an ECC operation on the data associated with an access operation (e.g., read operation) on the memory array 605. The bank of memory cells 610-a may access data as part of the read operation. This may include transmitting both the stored data and the stored parity data to the second ECC circuit 625. In some cases, transmitting data to the second ECC circuit 625 may also include transmitting data from a bank of memory cells 610 to a second ECC circuit 625, for example, via a data bus.

In some examples, the second ECC circuit 625 may be located outside a footprint of the array 605. Accordingly, transmitting data from a bank of memory cells 610 may include transmitting data out of the footprint of the array 605. Additionally or alternatively, the second ECC circuit 625 may be an array 605 level circuit as described herein. In this regard, transmitting data at 660 may further include transmitting data from multiple banks of memory cells 610 to the second ECC circuit 625. In some cases, transmitting data at 670 from multiple banks may be done simultaneously or concurrently. In other, cases, the array may be configured or controlled to schedule transmitting data at 670 such that data the second ECC circuit 625 receives data from different banks of memory cells 610 in a known or coordinated fashion.

At 670-b, parity data may also be transmitted from the array 605 to the second ECC circuit 625. In some cases, the parity data and data may be transmitted together. In other, cases parity data may be transmitted independently. The parity data may be transmitted via the same data bus as the data or may be transmitted via a different bus, such as a dedicated parity bus.

At 675, the second ECC circuit may perform a second ECC operation on the data. The second operation may include determining an error associated with the data, for example based on receiving parity data. In some, cases the second operation may include generating or determining a syndrome associated with the data. The syndrome may characterize one or more errors, error types, error rates, number of errors, or other characteristic of the data based in performing the second ECC operation. The second ECC operation may include transmitting the syndrome for the data to one of more components associated with the array 605 (e.g., local memory controller, external memory controller, peripheral components or the like). Additionally or alternatively, the second ECC operation may include modifying the data. For example, the second ECC operation may perform single bit error correction based on the received parity data.

At 680, the second ECC circuit 625 may transmit the data to the channel 635. This may include the second ECC circuit 625 transmitting modified data to the channel, for example based on performing the second ECC operation. In some cases, data transmitted to the channel 635 may be transmitted to a host device via the channel 635. Accordingly, the read operation including the second ECC operation may be complete upon the modified data being transferred from the second ECC circuit 625 and to the channel 635.

Figure 7:
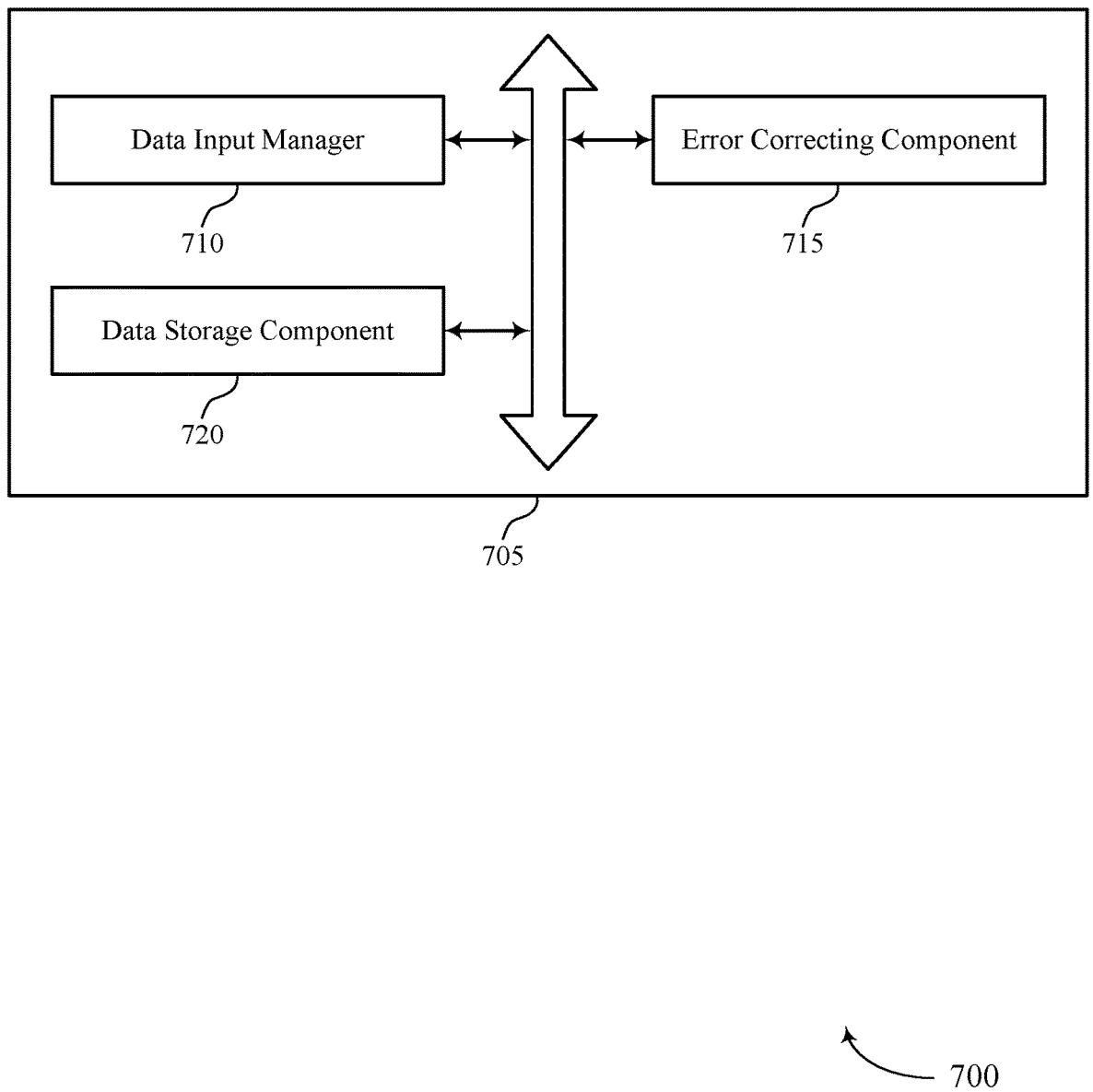
FIG. 7 shows a block diagram of a memory device that supports error correction in accordance with examples as disclosed herein.

FIG. 7 shows a block diagram 700 of a memory device 705 that supports error correction in accordance with examples as disclosed herein. The memory device 705 may be an example of portions of a memory device as described with reference to FIGS. 1-6. The memory device 705 may include a data input manager 710, an error correcting component 715, and a data storage component 720. Each of these modules may communicate, directly or indirectly, with one another (e.g., via one or more buses).

The data input manager 710 may receive data associated with a write operation for a first bank of an array of memory cells. In some examples, the data input manager 710 may receive second data associated with a write operation for a second bank of the array of memory cells.

The error correcting component 715 may perform, using a first ECC circuit, a first ECC operation on the data based on receiving the data. In some examples, the error correcting component 715 may perform, using a second ECC circuit, a second ECC operation on the data based on the data. In some examples, the error correcting component 715 may determine, by the second ECC circuit, an error indication for the data based on performing the second ECC operation. In some examples, the error correcting component 715 may correct, by the second ECC circuit, the data based on determining the error indication. In some examples, the error correcting component 715 may generate a set of parity data based on performing the first ECC operation on the data. In some examples, the error correcting component 715 may transmit, during the read operation, the set of parity data from the array of memory cells to the second ECC circuit, where performing the second ECC operation is based on receiving the set of parity data at the second ECC circuit. In some examples, the error correcting component 715 may modify the data based on performing the second ECC operation. In some examples, the error correcting component 715 may modify the data based at least on part on performing the first ECC operation. In some examples, the error correcting component 715 may perform, using a third ECC circuit, the first ECC operation on the second data. In some examples, the error correcting component 715 may perform, using the second ECC circuit, the second ECC operation on the second data as part of the read operation.

The data storage component 720 may store, as part of the write operation, the data in the first bank of the array of memory cells based on performing the first ECC operation on the data. In some examples, the data storage component 720 may retrieve, as part of a read operation, the data from the first bank. In some examples, the data storage component 720 may store, as part of the write operation, the set of parity data in the array of memory cells. In some examples, the data storage component 720 may transmit the modified data from the second ECC circuit to a channel. In some examples, the data storage component 720 may transmit the modified data from the first ECC circuit to the first bank. In some examples, the data storage component 720 may store, as part of the write operation, the second data in the second bank of the array of memory cells based on performing the first ECC operation on the second data. In some examples, the data storage component 720 may retrieve, as part of the read operation, the second data from the second bank.

Figure 8:
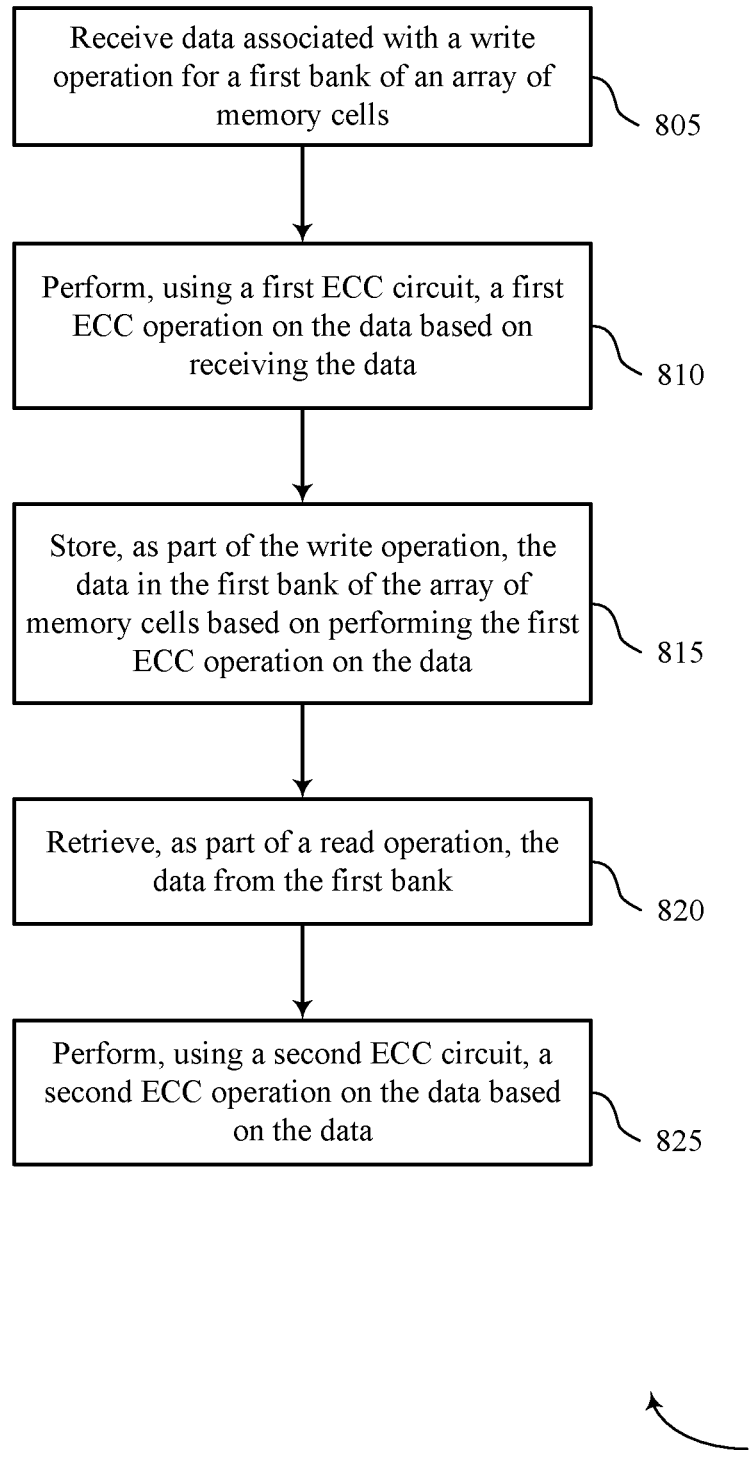
FIG. 8 shows a flowchart illustrating a method or methods that support error correction on a memory device in accordance with examples as disclosed herein.

FIG. 8 shows a flowchart illustrating a method or methods 800 that supports error correction on a memory device in accordance with examples of the present disclosure. The operations of method 800 may be implemented by a memory device or its components as described herein. For example, the operations of method 800 may be performed by a memory device as described with reference to FIG. 7. In some examples, a memory device may execute a set of instructions to control the functional elements of the memory device to perform the described functions. Additionally or alternatively, a memory device may perform portions of the described functions using special-purpose hardware.

At 805, the memory device may receive data associated with a write operation for a first bank of an array of memory cells. The operations of 805 may be performed according to the methods described herein. In some examples, portions of the operations of 805 may be performed by a data input manager as described with reference to FIG. 7.

At 810, the memory device may perform, using a first ECC circuit, a first ECC operation on the data based on receiving the data. The operations of 810 may be performed according to the methods described herein. In some examples, portions of the operations of 810 may be performed by an error correcting component as described with reference to FIG. 7.

At 815, the memory device may store, as part of the write operation, the data in the first bank of the array of memory cells based on performing the first ECC operation on the data. The operations of 815 may be performed according to the methods described herein. In some examples, portions of the operations of 815 may be performed by a data storage component as described with reference to FIG. 7.

At 820, the memory device may retrieve, as part of a read operation, the data from the first bank. The operations of 820 may be performed according to the methods described herein. In some examples, portions of the operations of 820 may be performed by a data storage component as described with reference to FIG. 7.

At 825, the memory device may perform, using a second ECC circuit, a second ECC operation on the data based on the data. The operations of 825 may be performed according to the methods described herein. In some examples, portions of the operations of 825 may be performed by an error correcting component as described with reference to FIG. 7.

In some examples, an apparatus as described herein may perform a method or methods, such as the method 800. The apparatus may include features, means, or instructions (e.g., a non-transitory computer-readable medium storing instructions executable by a processor) for receiving data associated with a write operation for a first bank of an array of memory cells, performing, using a first ECC circuit, a first ECC operation on the data based on receiving the data, storing, as part of the write operation, the data in the first bank of the array of memory cells based on performing the first ECC operation on the data, retrieving, as part of a read operation, the data from the first bank, and performing, using a second ECC circuit, a second ECC operation on the data based on the data.

Some examples of the method 800 and the apparatus described herein may further include operations, features, means, or instructions for determining, by the second ECC circuit, an error indication for the data based on performing the second ECC operation.

Some examples of the method 800 and the apparatus described herein may further include operations, features, means, or instructions for correcting, by the second ECC circuit, the data based on determining the error indication.

Some examples of the method 800 and the apparatus described herein may further include operations, features, means, or instructions for generating a set of parity data based on performing the first ECC operation on the data, and storing, as part of the write operation, the set of parity data in the array of memory cells.

Some examples of the method 800 and the apparatus described herein may further include operations, features, means, or instructions for transmitting, during the read operation, the set of parity data from the array of memory cells to the second ECC circuit, where performing the second ECC operation may be based on receiving the set of parity data at the second ECC circuit.

Some examples of the method 800 and the apparatus described herein may further include operations, features, means, or instructions for modifying the data based on performing the second ECC operation, and transmitting the modified data from the second ECC circuit to a channel.

Some examples of the method 800 and the apparatus described herein may further include operations, features, means, or instructions for modifying the data based at least on part on performing the first ECC operation, and transmitting the modified data from the first ECC circuit to the first bank.

Some examples of the method 800 and the apparatus described herein may further include operations, features, means, or instructions for receiving second data associated with a write operation for a second bank of the array of memory cells, performing, using a third ECC circuit, the first ECC operation on the second data, storing, as part of the write operation, the second data in the second bank of the array of memory cells based on performing the first ECC operation on the second data, retrieving, as part of the read operation, the second data from the second bank, and performing, using the second ECC circuit, the second ECC operation on the second data as part of the read operation.

It should be noted that the methods described herein describe possible implementations, and that the operations and the steps may be rearranged or otherwise modified and that other implementations are possible. Furthermore, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The term "layer" used herein refers to a stratum or sheet of a geometrical structure. Each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "substantially" means that the modified characteristic (e.g., a verb or adjective modified by the term substantially) need not be absolute but is close enough to achieve the advantages of the characteristic.

As used herein, the term "shorting" refers to a relationship between components in which a conductive path is established between the components via the activation of a single intermediary component between the two components in question. For example, a first component shorted to a second component may exchange signals with the second component when a switch between the two components is closed. Thus, shorting may be a dynamic operation that enables the flow of charge between components (or lines) that are in electronic communication.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
an array of memory cells comprising a plurality of banks;
a first error correcting code (ECC) circuit coupled with a first bank of the plurality of banks and configured to perform one or more ECC operations associated with a first access operation of the first bank, the first ECC circuit positioned within an area of a footprint of the array of memory cells; and
a second ECC circuit different from the first ECC circuit, the second ECC circuit coupled with the first bank of the plurality of banks and configured to perform one or more ECC operations associated with a second access operation of the first bank.

2. The apparatus of claim 1, wherein:
the second ECC circuit is positioned outside the area of the footprint of the array of memory cells.

3. The apparatus of claim 2, wherein the second ECC circuit is positioned at an edge of the array of memory cells.

4. The apparatus of claim 2, wherein the first ECC circuit is positioned in a complementary metal-oxide-semiconductor (CMOS) under the array of memory cells (CuA).

5. The apparatus of claim 1, wherein:
the first access operation of the first bank is a write operation and the first ECC circuit is configured to perform the one or more ECC operations associated with the first access operation as part of the write operation on the first bank; and
the second access operation of the first bank is a read operation and the second ECC circuit is configured to perform the one or more ECC operations associated with the second access operation as part of the read operation on the first bank.

6. The apparatus of claim 1, wherein the second ECC circuit is configured to perform the one or more ECC operations associated with the second access operation faster than the first ECC circuit is configured to perform the one or more ECC operations associated with the first access operation.

7. The apparatus of claim 1, wherein the first ECC circuit comprises a first circuit structure and the second ECC circuit comprises a second circuit structure different than the first circuit structure.

8. The apparatus of claim 7, wherein the first circuit structure comprises a first set of transistors having a first voltage threshold and the second circuit structure comprises a second set of transistors having a second voltage threshold.

9. The apparatus of claim 1, further comprising:
a dedicated conductive path coupled with the second ECC circuit and the first bank and configured to transport data associated with a read operation to the second ECC circuit.

10. The apparatus of claim 9, wherein the dedicated conductive path is configured to transport parity data associated with the read operation between the first bank and the second ECC circuit.

11. The apparatus of claim 1, wherein:
the array of memory cells is positioned on a first layer;
the first ECC circuit is positioned on a second layer that is located below the first layer; and
the first ECC circuit is distributed across at least a portion of the first bank.

12. The apparatus of claim 11, wherein:
each bank of the plurality of banks is subdivided into multiple tiles; and
the first ECC circuit is coupled with multiple tiles of the first bank.

13. The apparatus of claim 1, wherein the array of memory cells is located on a first layer, the apparatus further comprising:
a plurality of first ECC circuits, wherein each first ECC circuit is located on a second layer below the array of memory cells located on the first layer and associated with at least one of the plurality of banks.

14. The apparatus of claim 1, wherein the second ECC circuit is located on a same layer as the first ECC circuit and is positioned between the array of memory cells and a channel.

15. A method, comprising:
receiving data associated with a write operation for a first bank of an array of memory cells;
performing, using a first error correcting code (ECC) circuit, a first ECC operation on the data based at least in part on receiving the data, the first ECC circuit positioned within an area of a footprint of the array of memory cells;
storing, as part of the write operation, the data in the first bank of the array of memory cells based at least in part on performing the first ECC operation on the data;
retrieving, as part of a read operation, the data from the first bank; and
performing, using a second ECC circuit different from the first ECC circuit, a second ECC operation on the data based at least in part on the data.

16. The method of claim 15, further comprising:
determining, by the second ECC circuit, an error indication for the data based at least in part on performing the second ECC operation.

17. The method of claim 16, further comprising:
correcting, by the second ECC circuit, the data based at least in part on determining the error indication.

18. The method of claim 15, further comprising:
generating a set of parity data based at least in part on performing the first ECC operation on the data; and
storing, as part of the write operation, the set of parity data in the array of memory cells.

19. The method of claim 18, further comprising:
transmitting, during the read operation, the set of parity data from the array of memory cells to the second ECC circuit, wherein performing the second ECC operation is based at least in part on receiving the set of parity data at the second ECC circuit.

20. The method of claim 15, further comprising:
modifying the data based at least in part on performing the second ECC operation; and
transmitting the modified data from the second ECC circuit to a channel.

21. The method of claim 15, further comprising:
modifying the data based at least on part on performing the first ECC operation; and
transmitting the modified data from the first ECC circuit to the first bank.

22. The method of claim 15, further comprising:
receiving second data associated with a write operation for a second bank of the array of memory cells;
performing, using a third ECC circuit, the first ECC operation on the second data;
storing, as part of the write operation, the second data in the second bank of the array of memory cells based at least in part on performing the first ECC operation on the second data;
retrieving, as part of the read operation, the second data from the second bank; and
performing, using the second ECC circuit, the second ECC operation on the second data as part of the read operation.

23. An apparatus, comprising:
an array of memory cells comprising a plurality of banks,
a first error correcting code (ECC) circuit coupled with a first bank of the plurality of banks and configured to perform one or more ECC operations associated with a write operation of the first bank, the first ECC circuit positioned within an area of a footprint of the array of memory cells, a second ECC circuit different from the first ECC circuit, the second ECC circuit coupled with the first bank of the plurality of banks and configured to perform one or more ECC operations associated with a read operation of the first bank, and the apparatus configured to:
  perform, using the first ECC circuit, a first ECC operation on data;
  store, as part of the write operation, the data in the first bank based at least in part on performing the first ECC operation on the data;
  retrieve, as part of the read operation, the data from the first bank; and
  perform, using the second ECC circuit, a second ECC operation on the data as part of the read operation.

24. The apparatus of claim 23, wherein:
the second ECC circuit is positioned outside the area of the footprint of the array of memory cells.

* * * * *